United States Patent [19]

Egloff

[11] Patent Number: 4,965,521
[45] Date of Patent: Oct. 23, 1990

[54] METHOD AND APPARATUS FOR COMPENSATING EDDY CURRENT EFFECTS IN A MAGNETIC RESONANCE DEVICE HAVING PULSED MAGNETIC FIELD GRADIENTS

[75] Inventor: Heinz Egloff, Fremont, Calif.

[73] Assignee: Spectroscopy Imaging Systems, Fremont, Calif.

[21] Appl. No.: 392,872

[22] Filed: Aug. 11, 1989

[51] Int. Cl.$^5$ ............................................ G01R 33/20
[52] U.S. Cl. .................................... 324/312; 324/318
[58] Field of Search .............. 324/300, 307, 312, 313, 324/314, 318, 322; 128/653; 335/216

[56] References Cited

U.S. PATENT DOCUMENTS

| | | | |
|---|---|---|---|
| 3,873,909 | 3/1975 | Ernst | 324/307 |
| 4,585,992 | 4/1986 | Maudsley et al. | 324/309 |
| 4,585,995 | 4/1986 | Flugan | 324/322 |
| 4,647,858 | 3/1987 | Bottomley | 324/322 |
| 4,698,591 | 10/1987 | Glover et al. | 324/307 |
| 4,703,275 | 10/1987 | Holland | 324/318 |
| 4,733,189 | 3/1988 | Punchard et al. | 324/318 |
| 4,808,956 | 2/1989 | Aubert | 324/318 |
| 4,920,316 | 4/1990 | Egloff | 324/318 |
| 4,933,626 | 6/1990 | Halbach et al. | 324/309 |

Primary Examiner—Michael J. Tokar
Attorney, Agent, or Firm—Lawrence C. Edelman

[57] ABSTRACT

A method and apparatus for the compensation of an eddy current magnetic field in the magnetic field of a pulsed gradient coil in an MR scanning apparatus, wherein: an MR-active sample is positioned along a given coordinate axis within a magnetic field of the gradient coil and away from its isocenter; a plurality of time-sequential gradient coil pulses are applied to the gradient coil for generating a corresponding plurality of gradient magnetic field pulses; the sample is irradiated with an RF excitation pulse a given time delay which is increased following application of each of the gradient coil pulses, so as to generate a plurality of time-sequential MR signals; each of the MR signals are measured, Fourier transformed and stored as data, the data representative of the eddy current magnetic field; correction coefficients are calculated for compensating the magnetic field of the gradient coil with respect to the eddy current magnetic field using peak frequency shift data determined from the stored data; and the calculated correction coefficients are applied so as to generate a pre-distorted gradient coil pulse which will compensate for the affect of said eddy current magnetic field upon said gradient coil magnetic field.

13 Claims, 9 Drawing Sheets

METHOD AND APPARATUS FOR COMPENSATING EDDY CURRENT EFFECTS IN A MAGNETIC RESONANCE DEVICE HAVING PULSED MAGNETIC FIELD GRADIENTS

BACKGROUND OF THE INVENTION

1. Field of the Invention

The invention relates to magnetic resonance (MR) devices such as magnetic resonance imagers and spectrometers, and more particularly, to a method and apparatus for substantially reducing an eddy current disturbance in an MR device having a pulsed magnetic field gradient coil.

2. Description of the Prior Art

MR systems are based on the phenomenon of nuclear magnetic resonance (NMR). When an object is placed in a magnetic field, the field causes the spin vectors of certain types of nuclei having a net magnetic moment (e.g. $^1H$, $^{13}C$, $^{31}P$ and $^{23}Na$) to orient themselves with respect to the applied field. These nuclear spin vectors, when supplied with the right amount of energy, will reorient themselves in the field in accordance with the applied energy and emit or absorb energy in the process. The energy needed to perturb the nuclear spin vectors is in the radio frequency (RF) range, and the specific frequency depends upon the strength of the magnetic field which is experienced by the nuclei. In MR devices which do not provide electrical control of the spatial positioning of the applied magnetic fields, the sample is placed in a large, uniform, static magnetic field. The sample of MR active material is perturbed by a pulse of radio frequency energy applied to an RF coil, and the frequency of the nuclear spin vectors are sensed by the RF coil and response signals of the perturbation recorded. A measure of signal intensity as a function of resonance frequency or magnetic field at the nucleus (e.g., the free induction decay (FID) signal is obtained and analyzed, in a manner well known, to derive an image or spectroscopic information about the sample.

Imaging and spatially dependent spectroscopic analysis methods carry the above-described MR technique one step further by using magnetic field gradients in addition to a static primary background (main) uniform magnetic field. Since the resonant frequency of the MR active nuclei depends upon the precise magnetic field strength imposed upon it, applied field gradients are used to provide a technique for encoding spatial information into the sensed frequency response signals. MR devices correlate signal intensity at a given frequency with sample concentration and relaxation parameters at a given location. This provides spatial information which is used to make a map or image of the object, based upon signal intensity variations due to concentration and/or relaxation time differences. In a spectrometer, these field gradients allow a spatial selection of a particular portion of the sample object to be analyzed. The field gradients are produced with a set of gradient coils. These coils are often referred to as "pulsed gradient coils" because they are energized by pulses which grade the main field in two or more orthogonal directions.

Imaging the entire body of a patient, for example, typically requires a steady, high homogeneity, main field and highly linear gradients in the range of, for example, 0.1-1.0 gauss/cm with rise and fall times as short as possible, typically on the order of 0.1 to 1.0 milliseconds. An axial gradient (i.e. in the "Z" direction) is typically produced by solenoid coils while radial gradients (which define "X" and "Y" coordinates) are formed by saddle-shaped coils, as well known.

Regardless of the way in which the static background field is produced, for example by a superconducting magnet system, the changing magnetic fields which result from the pulsing of the gradient coils will induce eddy currents in any nearby conducting media. In the case of MR devices using superconducting magnets, most of the eddy currents are induced in the radiations shields which are designed to reduce evaporation of the cryogens. Eddy currents are also induced into the shim coil system and/or RF shield used to decouple the gradient coils from the RF coil.

Eddy currents have an adverse effect on both the spatial and temporal quality of the desired gradient fields. The eddy currents themselves generate a magnetic field which superimposes on the field produced by the gradient coils, thereby disturbing the gradient coil field from its desired level and quality, in both space and time. One observes, for example, an approximately exponential rise and decay of the gradient fields during and after, respectively, the application of a rectangular current pulse to the gradient coil. The result of this perturbation is that the amplitude and phase characteristics of the MR signals sensed by the RF coil are distorted, thereby reducing the accuracy of the spectroscopic analysis or the quality of the generated images. Therefore, it is necessary that the eddy currents be carefully controlled, compensated for or reduced to an insignificant level.

As known to those familiar with MR devices, basically two different approaches are used to eliminate the effects caused by eddy currents. One approach is to provide a self-shielded gradient coil which, in concept, prevents the gradient field from penetrating to the surrounding structure of the main magnet. Thus, the eddy current generated magnetic fields are avoided altogether. U.S. Pat. No. 4,733,189 issued Mar. 22, 1988 is illustrative of this technique and discloses an active shield. This approach suffers from several drawbacks. Firstly, the diameter of the gradient coil is reduced due to the presence of the active shield. This limits the size of the objects which can be investigated. Secondly, the power consumption of the gradient coil is increased due to the close proximity of the active shield to the gradient coils. Furthermore, any eccentricity between the active shield and the gradient coils produces a base field shift during application of the gradient pulse. Since both magnet and gradient amplifier designs have been pushed to the edge of their relevant technology, these drawbacks are quite severe and have limited the wide spread implementation of actively shielded gradient coils.

A second approach is to provide gradient pulse modification in a manner so as to reduce or eliminate the effects of eddy currents. This modification is typically achieved by superimposing a desired gradient pulse shape with a set of mono-exponential functions. Although hardware used to achieve the super is well known (see, for example, U.S. Pat. No. 4,703,275 of G. Neil Holland, incorporated herein by reference), the calculation of the circuit component values has proven to be extremely difficult. U.S. Pat. No. 4,698,591 of Glover et al. (incorporated herein by reference), relates to a method for calculating the exponential functions for deconvolving the desired gradient pulse shape by analyzing the phase characteristics of the free induction decay (FID) signal. After an initial estimate is made of the exponential function chisquared minimization techniques of a Taylor's series expansion about the initial estimate point, is used for defining the multiexponential functions. Since acquisition and analysis of the phase of the FID signal is not a technique conventionally found in an MR device, such acquisition and analysis of the phase of the FID signal must be specifically acquired and processed in the MR device. Additionally, chi-squared minimization techniques and Taylor's series expansion are further signal processing techniques not found in MR devices and therefore must be specially supplied.

Thus, the present invention is directed to a method and apparatus for measuring the effects of eddy currents and accurately calculating coefficients which can be used to cancel or compensate the effects of eddy currents. These coefficients can be used to set the time constant and amplitude characteristics of a pre-emphasis filter of the type used in U.S. Pat. No. 4,703,275 (noted above) or can be used by the software of the MR computer system for initially generating the gradient current pulse with the proper "pre-distorted" leading and trailing edges. The transient nature of the composite field produced by the gradient coil and the eddy currents is evaluated with the inherent high sensitivity of the MR device by studying the FID signals in the frequency domain and offers significant improvements over the Glover technique in that special programming packages are not required for determining the phase of the FID signals nor for analyzing the phase response in order to calculate the amplitude and time constant correction coefficients. In the present invention, standard signal processing techniques already incorporated in the MR device, namely one-dimensional Fourier transformation processing, is utilized for quantifying the effects of the eddy currents.

SUMMARY OF THE INVENTION

A novel technique has been developed which allows the quantification and compensation of eddy currents due to pulsed magnetic field gradients. A small sample, containing an MR active substance is placed off the electrical center of the gradient coil. A plurality of magnetic field gradient pulses are sequentially applied, each followed by a successively increased variable delay, a 90° RF pulse and the acquisition of the resultant free induction decay. The sequentially acquired free induction decays, which are affected by the decaying eddy currents, are Fourier transformed into the frequency domain and their peak frequencies are evaluated as a function of the time delay between the end of the gradient pulse and the RF pulse in order to quantify the eddy current exponential decay and thereby develop appropriate correction coefficients for compensation of the eddy currents.

The above-noted features and advantages of the invention will be apparent from the following description of the preferred embodiments and from the claims.

For a fuller understanding of the invention, reference should now be made to the following description of the preferred embodiments of the invention and to the accompanying drawings.

DETAILED DESCRIPTION OF THE PREFERRED EMBODIMENTS

Figure 1A:
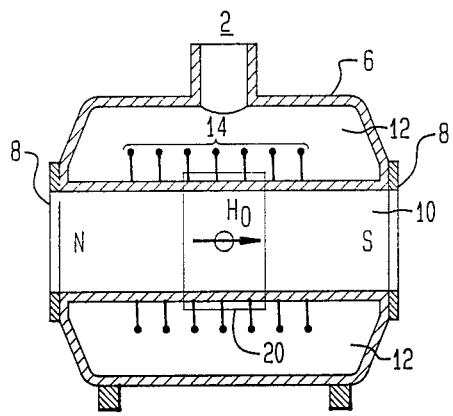
FIGS. 1a and 1b illustrate a typical magnetic resonance device (imager or spectrometer), partially in block diagram form and partially in cross-section and perspective view form.
Figure 1B:
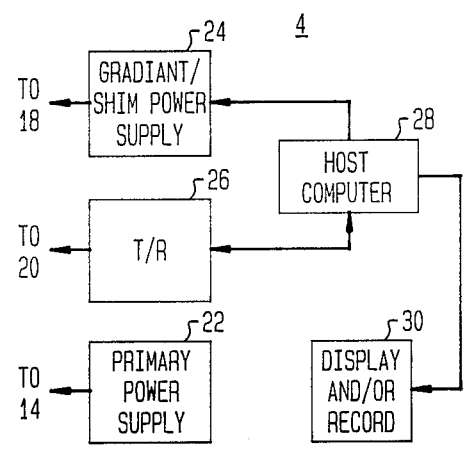

FIG. 1a illustrates a cross-section view of a superconducting magnet assembly 2 and a block diagram of an associated electronic system 4 for operating magnet 2 and developing an analysis (pictoral or spectral) of a test object (not shown) placed therein. FIG. 1b illustrates a perspective view of magnet 2 with a cut-out to show its superconducting magnetic field windings. Superconducting magnet 2 includes a cylindrical housing 6 and end plates 8 having a hole in the center thereof for allowing the test object to be placed in a cylindrical bore 10 of magnet 2. A cylindrical vessel 12 within housing 6 includes a base (main) magnetic field winding 14 for developing a base magnetic field $H_o$ which is axially aligned within bore 10.

For providing a high magnetic field, i.e., in the order of 1-10 tesla, winding 14 is supercooled by submersion in liquid helium contained within the walls of vessel 12. Although not shown in detail, vessel 12 typically includes a metallic chamber containing liquid nitrogen, which surrounds an additional metallic chamber containing liquid helium. Furthermore, at least one set of radiation shields is typically included within chamber 12 for providing insulation between the liquified gases and reduction of their evaporation rate due to thermal radiation.

As shown in FIG. 1b, a gradient coil former 16 serves as a mounting for gradient coil assembly 18 having X, Y and Z gradient coils and a radio frequency (RF) coil 20. The gradient coil assembly with RF coil is then positioned inside bore 10 of magnet 2.

Electronic system 4 includes a primary power supply 22 for supplying current (at least initially) to primary winding 14, a gradient/shim power supply 24 for supplying currents to gradient winding assembly 18 (and shim coils, not shown) and a transmit and receive (T/R) module 26 which transmits RF energy to RF coil 20 and receives magnetic resonance signals picked up by coil 20 which result from the precessing of the protons in the test object. A host computer 28 controls the application of gradient signals to gradient coil assembly 18 and, via its connection to T/R module 26, controls the processing of transmission and reception signals to and from RF coil 20. T/R module 26 and host computer 28 processes the received signals in a well known manner using one or two-dimensional Fourier transformation techniques for developing an image signal (or a spectral analysis) of the test object which is then used to display and/or record the information via display/record unit 30. The above-described apparatus is constructed and operates as a conventional MR device of the type well known to those skilled in the art and commercially available from a variety of manufacturers.

In operation, gradient coils 18 generate substantially constant magnetic field gradients $G_x$, $G_y$ and $G_z$ in the same direction as the main magnetic field, wherein the gradients are directed in mutually orthogonal X-, Y-, and Z- axis directions of a Cartesian coordinate system. That is, if the magnetic field generated by main magnet 14 is directed in the Z direction and is termed $B_o$ and the total magnetic field in the Z direction is referred to as $B_z$, then $G_x = \delta B_z / \delta x$, $G_y = \delta B_z / \delta y$ and $G_z = B_z / \delta z$, and the Z-component of the magnetic field at any point (x, y, z) is given by $B(x,y,z,) = B_o + G_x X + G_y Y + G_z Z$. The $G_x$ gradient has no effect on the plane $x=0$ located at the center point of the X- axis. Similarly, $G_y$ and $G_z$ have no effect on the planes $y=0$ and $Z=0$, located at the center points of the Y- and Z- axes, respectively. The point (0,0,0) is referred to as the "isocenter" and is that point in space where none of the gradients have any effect. The isocenter is normally situated substantially at the center of the static magnetic field volume.

As well known, the gradient magnetic fields are utilized in combination with RF pulses supplied from T/R module 26 to encode spatial information into the MR signals emminating from the region of the test object being studied. In operation RF coil 20 selectively excites certain protons within the test object, and thereafter receives MR signals from the excited protons as they return (precess) to an equilibrium position established by the base main and gradient magnetic fields.

Unfortunately, the composite magnetic field (main field plus gradient field) affecting the test object is perturbed by magnetic field effects from eddy currents induced in one or more of the conducting media surrounding the gradient coils, such as the metallic walls of the closest radiation shields of chamber 12 (commonly referred to as cold or radiation shields). The eddy currents induced into one or more of the cold shields by the pulses applied to the gradient coils each produce their own magnetic field which opposes the desired applied gradient field and which decay with a time constant which is characteristic of that particular cold shield. The perturbation caused by the eddy currents distorts the phase and amplitude of the MR signals, thereby reducing the image quality/spectroscopic analysis accuracy in imagers/spectrometers, respectively.

In accordance with an aspect of a preferred embodiment of the present invention, the eddy currents are substantially confined to a single conducting media. If there are several conducting media, one of them must be made dominant, typically the one closest to the gradient coil. This can be achieved by designed the first conductive cylinder (radiation shield) inside the magnet to be of very low resistance. Complete confinement can be achieved if the wall thickness of the cylinder is much larger than the skin depth of the lowest frequency component of a particular gradient switching sequence.

Figure 1C:
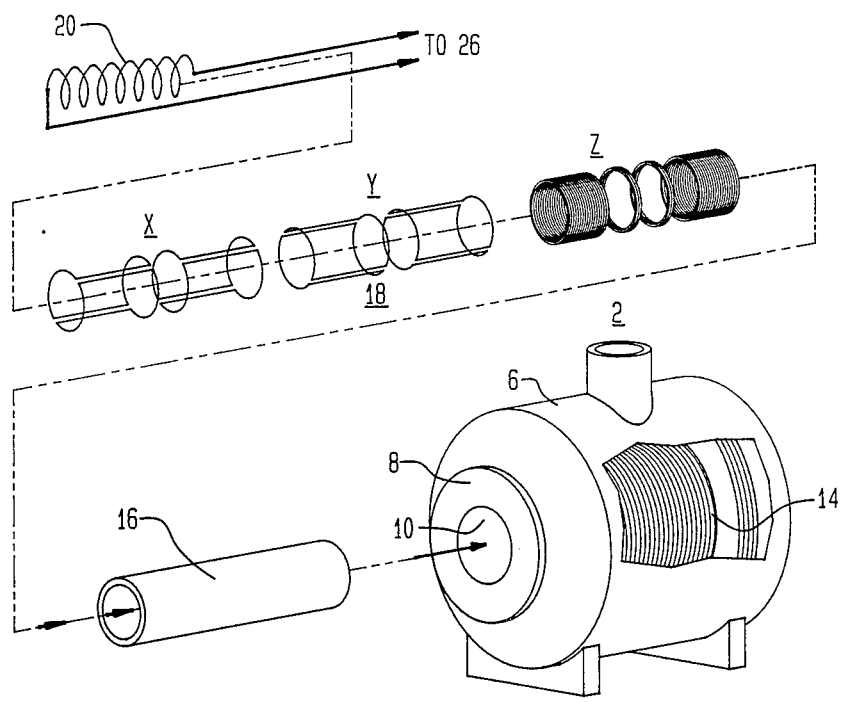
Figure 2:
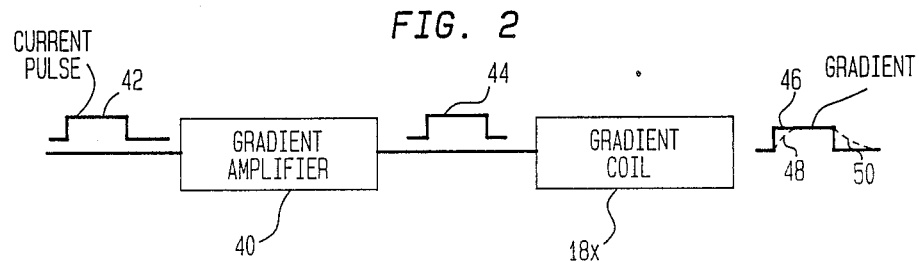
FIG. 2 illustrates the conventional gradient amplifier and gradient coil chain.

Referring now to FIG. 2, there is shown a gradient amplifier 40 (included in gradient/shim power supply 24 shown in FIG. 1) for energizing gradient coil 18X to produce the $G_x$ gradient. Under ideal operating conditions, a rectangular current pulse 42 applied to amplifier 40 would be amplified, as indicated by wave shape 44, and when used to energize the gradient coil, would result in a substantially rectangular gradient magnetic field pulse 46 being produced. However, as described earlier, because of the coupling to lossy structures (e.g., radiation shields) and spurious components due to induction of eddy currents, in practice, the resulting magnetic field gradient has a finite rise and fall time as indicated at 48 and 50, respectively. As noted earlier, such gradient distortions can lead to loss of signal and unintended phase dispersions of the nuclear spin vectors.

Figure 3:
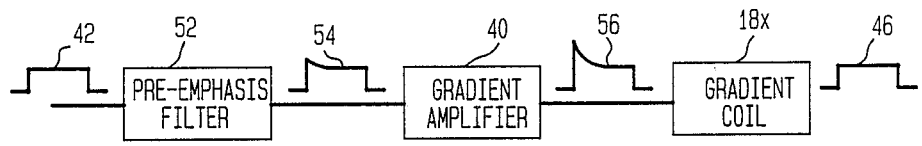
FIG. 3 illustrates the chain of FIG. 2, modified to include a pre-emphasis filter for compensating eddy currents according to the method and apparatus of the invention.

In one embodiment of the invention, the gradient distortions are reduced by application of a current pulse 42, as shown in FIG. 3, to a pre-emphasis filter which has amplitude and time constant coefficients set in accordance with the invention to pre-distort the current pulse, as indicated by waveshape 54. The amplified current pulse 56 is then applied to the gradient coil to produce the desired rectangular gradient pulse 46. Since in typical MR applications, gradient pulses are applied in at least each of the axes of the Cartesian coordinate system, an MR system for practicing the invention would normally have means functionally similar to that shown in FIG. 3 to achieve correction along all three axes. However, for simplicity, the following discussion will refer to correction along only one of the axes and would be repeated, if correction along other axes were required.

In order to determine how current pulse 42 in FIG. 3 should be pre-distorted (and therefore the amplitude and time constant coefficients for pre-emphasis filter 52 needed to achieve the desired pre-distortion) the characteristics of the gradient distortion to be eliminated must first be measured and analyzed. The manner in which this is accomplished, in accordance with the invention, will be described next.

Figure 4:
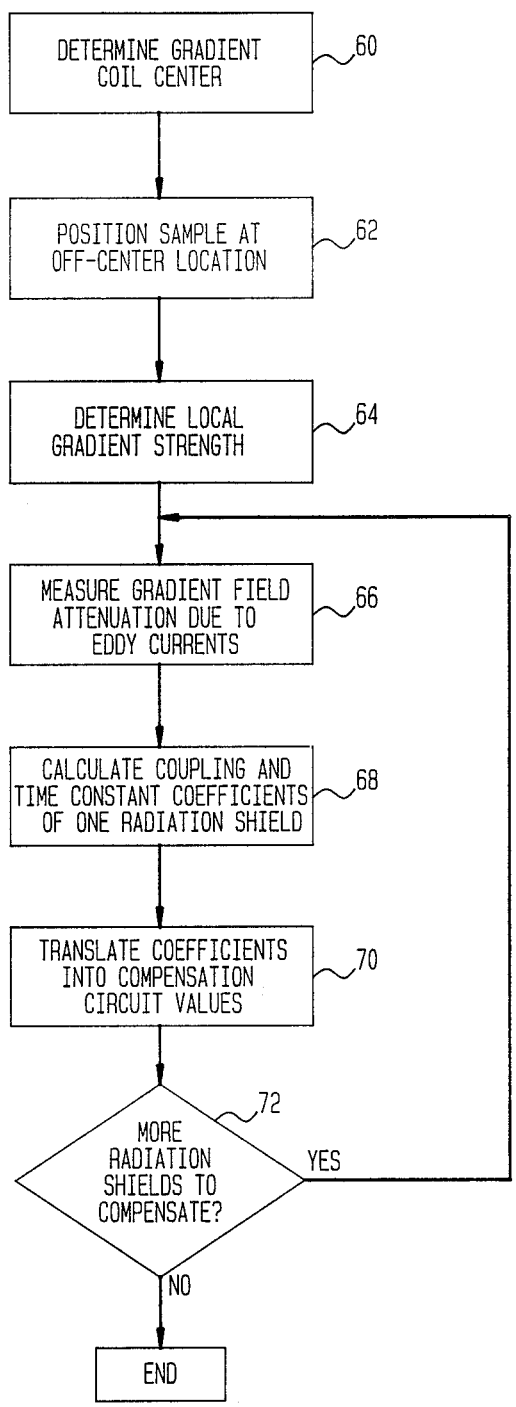
FIG. 4 illustrates a flow-chart of the invention.

FIG. 4 illustrates the flow chart of the invention. The flow chart will be briefly described and then followed with a more detailed description. In step 60, the electrical isocenter of the gradient coil is found. When this is completed, in step 62, an MR active sample is displaced a distance X from the isocenter, which distance is still within the linear range of the gradient coil and which allows an MR signal of significant amplitude to be developed, e.g., 4 cm. Next, in step 64, the local gradient field strength is determined in order that it can be used in a later step for calculating the correction coefficients for compensating the eddy currents. Next, in step 66, the gradient field attenuation due to eddy currents is determined by recording and analyzing the frequency shift characteristics of the FID MR signals obtained in the presence of the uncompensated gradient field. Thereafter, in step 68, the frequency shift data gathered from step 66 is used for calculating the coupling and time constant coefficients needed for compensating the effects of the eddy currents. If one of the radiation shields has not been made fully dominant, multi-exponentially decaying eddy currents will exist and the eddy current effect having the longest time constant is characterized in this step. Next, in step 70, the coefficients calculated in step 68 are translated into compensation circuit values for pre-emphasis filter 52. Thereafter, in step 72, if it is known that there is only one radiation shield causing the eddy current effect, this would be the end of the compensation procedure (for the x-axis). If however, the eddy current effect is multi-exponential, steps 66 through 70 are repeated, once for each of slowest decaying (longest time constant) eddy current effect remaining after the prior compensation.

Although the above-described procedure applies the calculated coupling and time constant coefficients to set the time constant characteristics of a pre-emphasis filter, in an alternative embodiment of the invention, the coupling and time constant coefficients can be utilized in other filter implementations, such as an active filter, or may be utilized by the computer system of the MR device in order to initially generate current pulse 42 in order that it has the proper predistortion.

Figure 5:
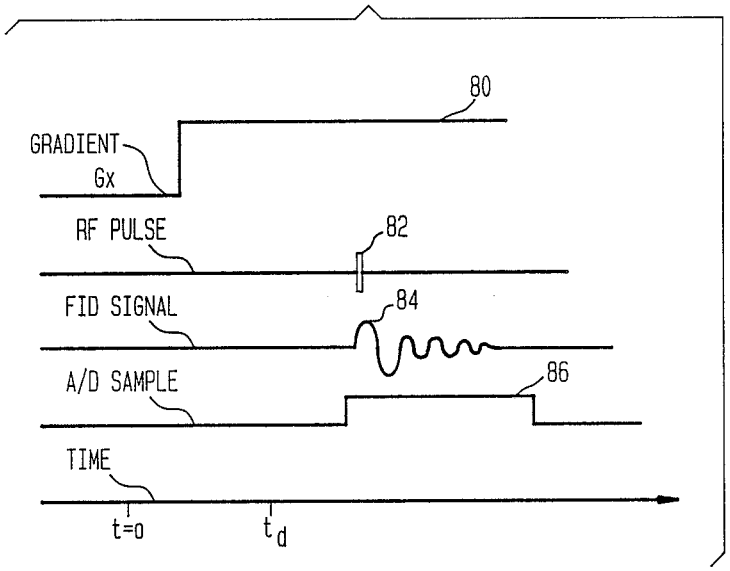
FIGS. 5 illustrates an exemplary pulse sequence used for measuring local gradient strength.

A detailed description of the flow chart of FIG. 4 follows. For step 60, although an inductive pick-up coil can be used to sense the magnetic field gradients inside gradient coil assembly 18, for simplicity, it is preferable to use only the components which are standard in MR devices for accomplishing the present invention. Therefore, for finding the isocenter of the gradient coil, a small sample composed of an MR active substance, conveniently a small bottle containing approximately 1 cc of water, is placed at a position (x,y,z) in gradient coil assembly 18, which position is intended to be a best estimate of the isocenter (0,0,0). As shown by waveforms 80-86 of FIG. 5, a magnetic field. gradient pulse 80 of long duration is applied, followed by a time delay $T_d$. A short 90° RF pulse 82 is then applied. The resulting free induction decay (FID) signal 84 is sampled, digitized, Fourier transformed and analyzed. The angular resonant frequency following the leading edge of a gradient pulse can be generally expressed by:

$$\omega_x(t) = \gamma B_0 + \gamma \left[ G_x \times \left( 1 - \sum_{k=1}^{N} a_k e^{-t/\tau_k} \right) \right] \quad [1]$$

where:
 ωx(t) = time dependent angular resonance frequency at position x
 γ = gyromagnetic ratio
 $B_o$ = main magnetic field After the delay period $t_d$, all time-dependent eddy current effects have decayed and equation 1 becomes $$\omega x(t) = \gamma(B_o + G_x x) \quad [2]$$

Furthermore, at displacement $x=0, \omega_x = \gamma B_o$. Consequently, the FID signal sensed when the gradient pulse is applied will have no frequency shift, when analyzed in the frequency domain, as compared to the FID signal which is sensed when there is no gradient pulse applied. Therefore, the MR active sample can be iteratively repositioned and the FID's analyzed until the above condition ($\omega_x = \gamma B_o$) is reached. Alternatively, since $B_o$ can be calculated, $\omega_x$ is measured at two points with a known distance therebetween, and analyzed to calculate at which displacement $\omega_x$ would equal the calculated value for $\gamma B_o$.

Figure 6:
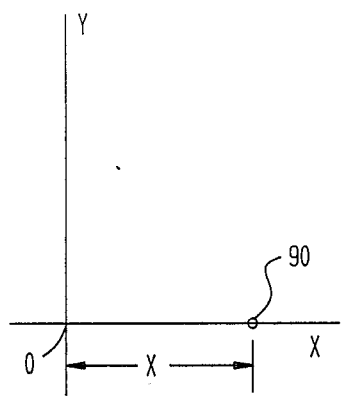
FIG. 6 illustrates an MR active sample positioned away from the isocenter of the MR system.

For step 62, the MR sample can be placed at any position along the coordinate axis under investigation except the origin of the gradient field. A typical displacement which offers both high signal sensitivity and is well within the linear range of a typical gradient coil is 4 cm. FIG. 6 illustrates positioning of an MR active sample 90 a distance "x" from the isocenter of gradient coil 18. Sample 90 will serve as the source of the MR signals used to study the gradient distortion caused by eddy currents.

For step 64, as previously noted, the measurement of local gradient strength is a pre-requisite for the calculation of the coupling constants between the gradient coil and the radiation shield. Using the sequence of FIG. 5 for the measurement of the local gradient strength, with the MR sample located off-center and after a delay period sufficiently long to allow for the decay of all eddy current effects, the angular resonant frequency $\omega_x$ of the FID signal is determined in accordance with equation 2. Since $\gamma B_o$ is the angular resonant frequency in the absence of a gradient field, the frequency shift $\omega_g$ due to the local gradient can be calculated as $$\Phi_g = \gamma G_x x = w_x - \gamma B_o \quad [3]$$

Thus, $\gamma B_o$ is measured as $\Phi_g$ in the absence of a gradient field, $\omega_x$ is determined as noted above and equation 3 is then solved for $\omega_g$.

Figure 7:
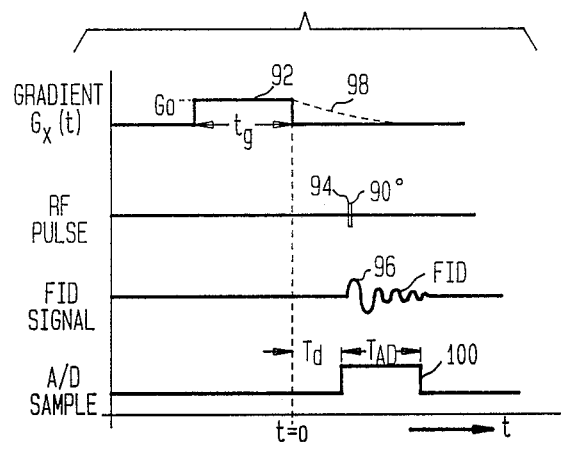
FIG. 7 illustrates an exemplary pulse sequence in accordance with the invention for acquiring the FID signals used for measuring the gradient field attenuation due to eddy currents.
Figure 8:
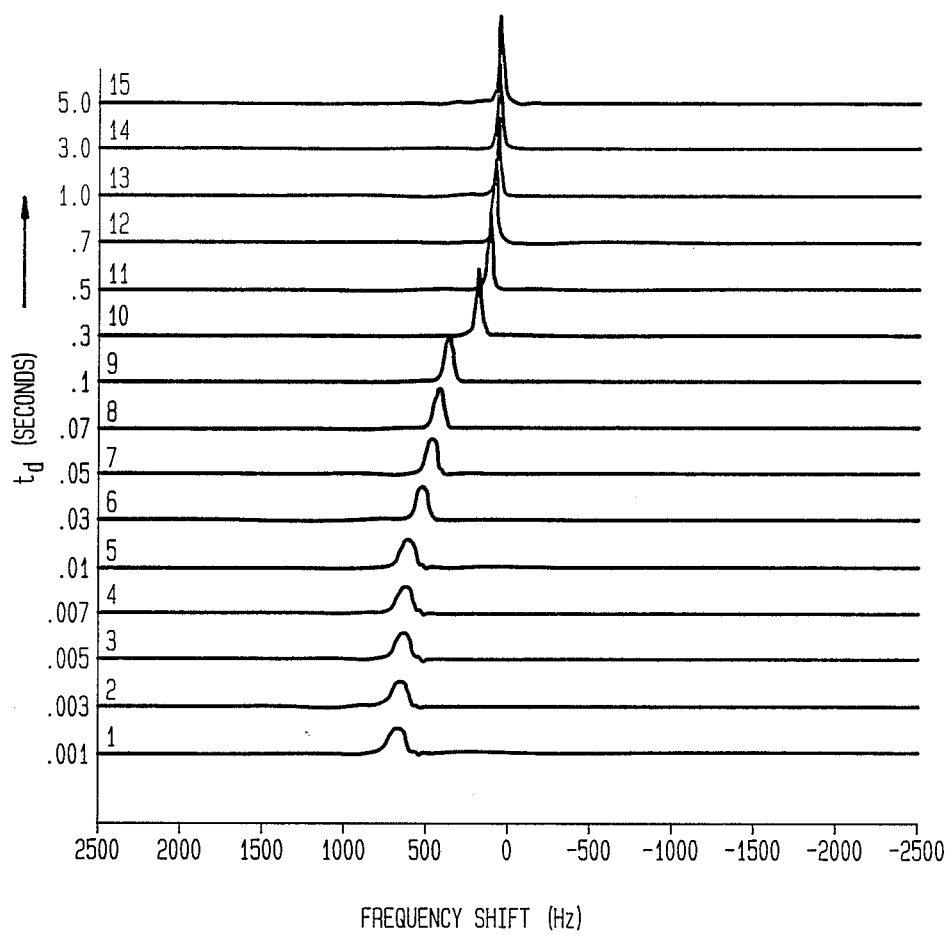
FIG. 8 illustrates a frequency domain representation of the FID signals acquired using the pulse sequence of FIG. 7.

FIG. 7 illustrates the pulse sequence employed for the measurement of the gradient field attenuation due to eddy currents (corresponding to step 66 of FIG. 4). As shown therein, a gradient pulse 92 of long duration $t_g$, typically 1000 ms is applied, followed by a time delay $t_d$ and a short, non-selective selective 90° RF pulse 94 having a duration typically of 10 μs. The free induction decay signal 96, which is frequency modulated by the decaying eddy currents (their effect upon the gradient pulse indicated by dashed lines 98), is then acquired during the A/D acquisition interval 100. The above procedure is repeated, with a plurality (n) of long duration gradient pulses followed by RF pulses having variable $t_d$ delays between the end of the gradient pulse and the application of the 90° RF pulse. The acquired plurality of FID signals are then Fourier transformed into the frequency domain, as illustrated in FIG. 8. In the procedure illustrated in FIG. 8, $t_d$ varies from 0.001 seconds through 5 seconds in n=15 steps and is plotted vertically on a logarithmic scale. The horizontal axis represents the frequency shift of the FID signals (i.e., normalized with respect to the local gradient strength $\omega_g$). Analysis of the shifting of the peak frequencies of the Fourier transformed FID signals yields the desired measurement of the eddy currents as a function of time delay $t_d$.

Figure 9:
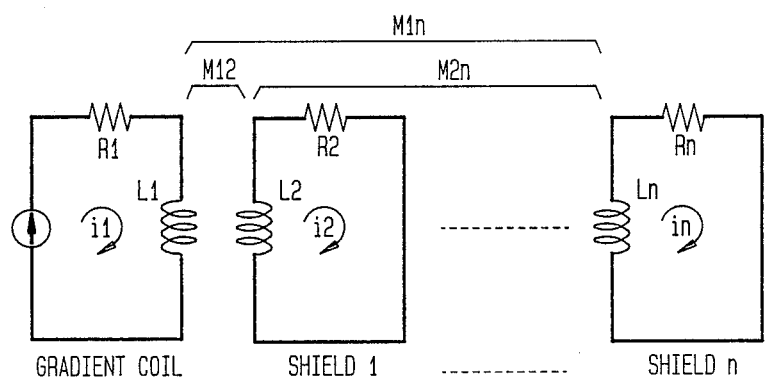
FIG. 9 illustrates a model of a superconducting magnet consisting of a gradient coil having n radiation shields.

For calculation of the coupling and time constant correction coefficients (step 68), an MR device comprising a superconductive magnet with a set of radiation shields concentric with respect to the gradient coil is modeled as a system of mutually coupled lumped inductors and resistors. FIG. 9 depicts the magnetic equivalent model of such an MR device having n radiation shields, which model is used for calculation of the time constant and coupling correction coefficients, wherein each shield is modeled as a loop circuit having a resistor (R), inductor (L), mutual coupling coefficient (M) and current (i), with the gradient coil being driven by a constant current source.

The effects of eddy currents produced in the radiation shields are perfectly compensated for if the total magnetic flux Φ(t) is constant during the application of a gradient pulse and zero after the gradient pulse.

In accordance with an aspect of the invention (and the preferred embodiment of the MR device wherein one radiation shield is made dominant), the generalized model of FIG. 9 is greatly simplified, and therefore made practically useful, by only considering one radiation shield at a time. The inventor has found that due to the structural nature of MR devices, although there can be several exponential decays related to the eddy currents, each decaying with a different time constant, a simplification is possible where only one time constant, the longest, is considered at a time.

Thus, referring to FIG. 9, for a single radiation shield, applying Kirchhoff's voltage law to shield 1 and the gradient coil yields:

$$-M12 \, di1/dt + R2 \, i2 + L2 \, di2/dt = 0 \quad [4]$$

For ease of calculation, equation 4 is transformed into the s-domain:

$$-M12 \, s \, I1(s) + R2 \, I2(s) + L2 \, s \, I2(s) = 0 \quad [5]$$

Solving equation 5 for the current in the shield, $$I2(s) = (M12 \, s \, I1(s))/(R2 + L2 \, s) \quad [6]$$

The magnet can be considered a linear device where the magnetic flux ($\Omega$) is proportional to the current (i), we can write in the s-domain $$\Phi 2(s) = (M12 \, s \, \Phi 1(s))/(R2 + L2 \, s) \quad [7]$$

According to Lenz's law, the total flux $\phi t = \phi 1 - \phi 2$ ($\phi 1$ = the flux produced by the gradient coil and $\phi 2$ = the flux produced by shield 1). Therefore, using equation 7, $$\Phi t(s) = \Phi 1(s) \{1 - (M12 \, s)/(R2 + L2 \, s)\} \quad [8]$$

After substitution of the time constant for shield 1 as T2 = L2/R2, the magnet transfer function $H(s) = \Phi t(s)/\Phi 1(s)$ becomes:

$$H(s) = 1 - (M12 \, s)/(s + 1/T2) \quad [9]$$

To compensate for eddy currents following a normalized current step $I1u(t)$, the condition $$\Phi t(s) = H(s) \, \Phi 1(s) = 1/s \quad [10]$$

has to be satisfied. Solving for $\Phi 1(s)$, which is proportional to $I1(s)$, and substitution with equation 9, yields:

$$\Phi 1(s) = \frac{1/(1-M12)}{s + 1/T2(1-M12)} + \frac{1/T2(1-M12)}{s(s + 1/T2(1-M12))} \quad [11]$$

The inverse Laplace transform $L^{-1}(\Phi 1(s))$ yields the desired time domain function of $\Phi 1(t)$, which is proportional to $i1(t)$, and which is the necessary time domain function for compensating the normalized current pulse noted above, and is shown below:

$$L^{-1}(\Phi 1(s)) = \{M12/(1-M12)\} \, e^{-t/T2(1-M12)} \quad [12]$$

Thus, the amplitude correction coefficient is equal to $M12/(1-M12)$ and the time constant correction coefficient is equal to $T2(1-M12)$. The values for M12 and T2 can be extracted from the measurement of the uncompensated eddy currents by referring to the effect of the eddy currents upon the FID signals, shown in FIG. 8, using an exponential fit, wherein:

$$T2 = \{td(n) - td(n-1)\}/\ln\{\omega e(n)/\omega e(n-1)\} \quad [13]$$

and $$M12 = \{\omega e(n)/e^{-t/T2}\}/\omega g \quad [14]$$

where $\omega e(n)$ is the frequency shift due to eddy currents at the time delay td of index n (n varying from 1 to 15) and g is the frequency shift due to the local gradient (previously calculated).

The proper correction coefficients, i.e., time constant (TC) and amplitude (AMP), are calculated by applying equations 13 and 14 to the measurement data of FIG. 8. As previously noted, if there is no dominant radiation shield, it is an aspect of the invention to begin compensation calculation by considering the longest time constant component of the decaying eddy currents first. Thus, the measurement data is analyzed beginning at the longest of the time delays. At index (n) = 15, representing a 5 second delay between the end of the gradient pulse and the 90° RF pulse, the frequency shift is seen to be zero. At index (n) = 14, TC and AMP coefficients are indeterminent due to the zero frequency shift data from index 15. However, for the remainder of the indexes, TC and AMP coefficients are calculated using equations 13 and 14 and the results of such calculation are shown in tabular form in TABLE I below.

TABLE I

| INDEX | DELAY | FREQ | TC | AMP |
| --- | --- | --- | --- | --- |
| 15 | 5.000 | 0 |  | 0 |
| 14 | 3.000 | 2 | XXX | XXX |
| 13 | 1.000 | 12 | −1.243 | 27 |
| 12 | 0.700 | 29 | −0.343 | 226 |
| 11 | 0.500 | 59 | −0.289 | 332 |
| 10 | 0.300 | 125 | −0.265 | 386 |
| 9 | 0.100 | 305 | −0.223 | 478 |
| 8 | 0.070 | 359 | −0.185 | 524 |
| 7 | 0.050 | 403 | −0.173 | 538 |
| 6 | 0.030 | 459 | −0.153 | 558 |
| 5 | 0.010 | 550 | −0.111 | 601 |
| 4 | 0.007 | 562 | −0.136 | 591 |
| 3 | 0.005 | 576 | −0.078 | 615 |
| 2 | 0.003 | 596 | −0.060 | 627 |
| 1 | 0.001 | 611 | −0.082 | 618 |

In the present example $\omega_g$ was 18,733 Hz.

Referring to TABLE I, it is seen that the TC and AMP data describe well behaved functions starting at Index 12. This is so because the data at Indexes 15 and 14 are to small to be reliable, and thereby introduce errors into the calculation of TC and AMP for Indexes 14 and 13. Therefore, from TABLE I, Index 12, the time constant of −0.343 seconds and the coupling coefficient of 226 Hz describes the longest exponentially decaying eddy current component. These values are applied to equation 12, wherein T2 = −0.343 and M12 = 226, yielding the calculated correction coefficients of TC = −0.336 seconds and AMP = 1% (i.e., 1% of the local gradient strength of 18,733 Hz = 187 Hz). These calculated values are then used to adjust pre-emphasis filter 52 of FIG. 3.

Figure 10:
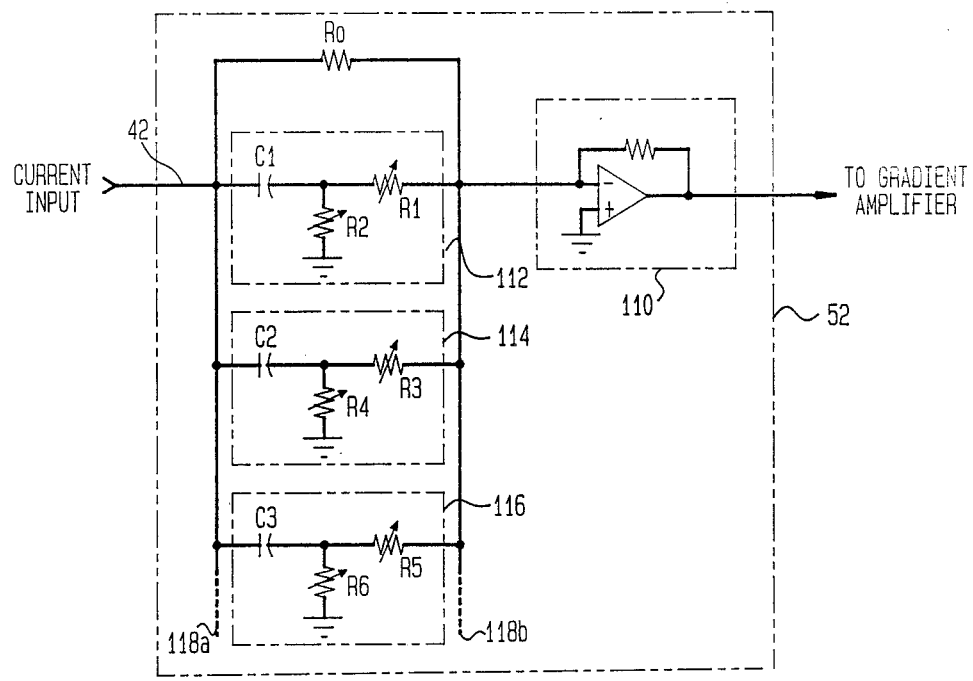
FIG. 10 illustrates an exemplary embodiment of a pre-emphasis filter.

An exemplary embodiment of a pre-emphasis filter is illustrated in circuit schematic form in FIG. 10. The filter includes an operational amplifier 110 and filter networks 112, 114 and 116. Although not shown, isolation amplifiers would also be included to isolate networks 112-116 from each other. The pre-distorted output is applied to the gradient amplifier (e.g., 40 of FIG. 3) for energizing the gradient coil. At its input, operational amplifier 110 is energized by a current pulse 42 through an input resistor $R_o$ and one or more parallel-connected RC networks 112-116. The number of RC networks depends upon the success of the MR device designer making only one of the radiation shields dominant. Dashed lines 118a and 118b suggest that additional RC networks may be added as needed. Each RC network is comprised at its input of a capacitor (e.g., C1) connected in series with an output variable resistor (e.g., R1). The common point between the capacitor and variable resistor is coupled to ground through a second variable resistor (e.g., R2). The circuit shown in FIG. 10 provides three exponential corrections since there are three RC networks. Preferably, only one RC network would be required.

Thus, C1, R1 and R2 are adjusted in any of several well known manners to provide a TC of −0.343 seconds and an AMP of 1%. In the present embodiment, the inventor adjusted the RC network, using an oscilloscope, until the output pulse had a leading edge which had a 1% over shoot (i.e., 101% of its uncompensated amplitude) and a decay time constant of −0.343 seconds. This completes the compensation for the longest decaying component of the eddy current magnetic field.

Figure 11:
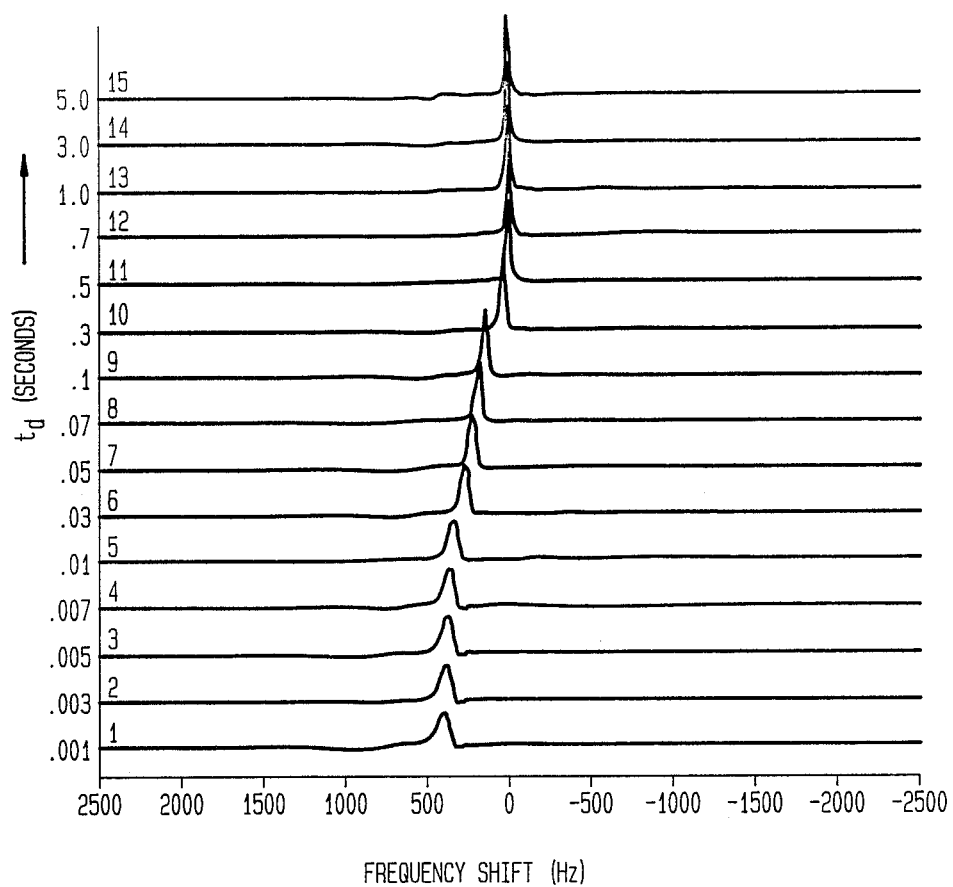
FIGS. 11, 12 and 13 illustrate a frequency domain representation of the FID signals acquired after successive compensations of a multi-exponentially decaying eddy current.

Next, if one of the radiation shields were not dominant, the above procedure can be repeated to compensate for the new longest remaining time constant of the decaying eddy currents. FIG. 11 illustrates the FID signals acquired in a manner similar to that shown in FIG. 8 after the above-noted compensation. Note that the frequency shift doesn't become appreciable until about index (n)=10, indicating the improvement due to the above-described compensation. While referring to FIG. 11 and applying equations 13 and 14 in a manner similar to that previously described with respect to FIG. 8, a TABLE II, shown below, is developed, which is a measure of the now partially compensated gradient field.

TABLE II

| INDEX | DELAY | FREQ | TC | AMP |
|---|---|---|---|---|
| 15 | 5.000 | 0 |  | 0 |
| 14 | 3.000 | 0 | XXX | XXX |
| 13 | 1.000 | −5 | XXX | XXX |
| 12 | 0.700 | −5 | XXX | XXX |
| 11 | 0.500 | −2 | XXX | XXX |
| 10 | 0.300 | 27 | XXX | XXX |
| 9 | 0.100 | 137 | −0.123 | 309 |
| 8 | 0.070 | 178 | −0.113 | 331 |
| 7 | 0.050 | 215 | −0.107 | 343 |
| 6 | 0.030 | 264 | −0.098 | 359 |
| 5 | 0.010 | 332 | −0.087 | 373 |
| 4 | 0.007 | 349 | −0.060 | 393 |
| 3 | 0.005 | 362 | −0.058 | 394 |
| 2 | 0.003 | 376 | −0.050 | 399 |
| 1 | 0.001 | 391 | −0.052 | 398 |

Referring to TABLE II it is seen that the TC and AMP data become well behaved at Index 8 and therefore, for correction of the next exponential component of the decaying eddy currents, a TC of −0.113 seconds and an AMP of 331 Hz is used. Applying these values to equation 12, the calculated correction coefficients are TC=−0.111 seconds and AMP=2%. Thus, the resistor settings of filter section 114 of FIG. 10 are adjusted to establish these values for pre-emphasis filter 52.

Figure 12:
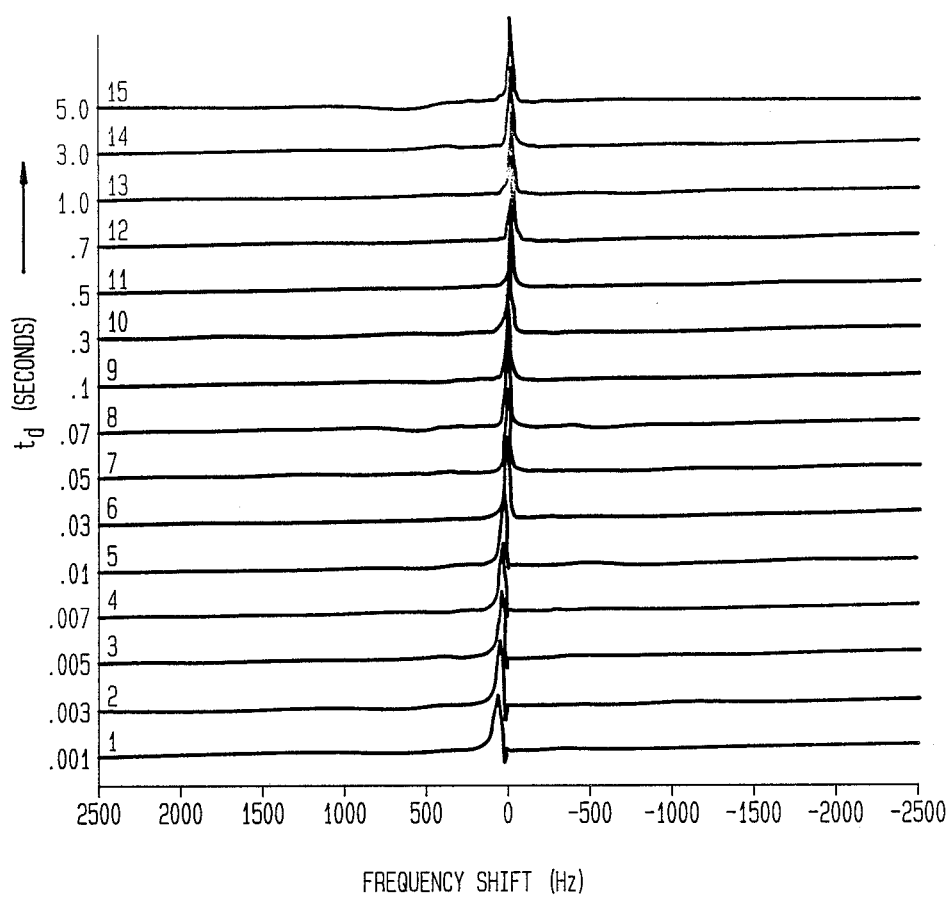

Next, the above procedure is repeated a third time, with FIG. 12 indicating the Fourier transformed FID signals and TABLE III indicating the calculated TC and AMP values.

TABLE III

| INDEX | DELAY | FREQ | TC | AMP |
|---|---|---|---|---|
| 15 | 5.000 | 0 |  | 0 |
| 14 | 3.000 | 0 | XXX | XXX |
| 13 | 1.000 | −5 | XXX | XXX |
| 12 | 0.700 | −7 | XXX | XXX |
| 11 | 0.500 | −5 | XXX | XXX |
| 10 | 0.300 | 2 | XXX | XXX |
| 9 | 0.100 | 15 | −0.112 | 36 |
| 8 | 0.070 | 15 | XXX | XXX |
| 7 | 0.050 | 15 | XXX | XXX |
| 6 | 0.030 | 17 | −0.130 | 22 |
| 5 | 0.010 | 34 | −0.029 | 48 |
| 4 | 0.007 | 42 | −0.016 | 65 |
| 3 | 0.005 | 46 | −0.018 | 61 |
| 2 | 0.003 | 56 | −0.011 | 75 |
| 1 | 0.001 | 66 | −0.013 | 71 |

Referring to TABLE III it is seen that there is still some uncompensated eddy current left. The data at Index 4 is the longest delay where the TC and AMP values become well behaved. Therefore, for the next correction procedure, a TC of −0.016 and AMP of 65 Hz is used. Applying these values to equation 12 results in a TC of −0.016 and AMP of 0%, which is then used to adjust the component values in network 116 of the pre-emphasis filter shown in FIG. 10. Alternatively, since the TC and AMP values of TABLE III are so close for Indexes 1–4, an average of these values can be used.

Figure 13:
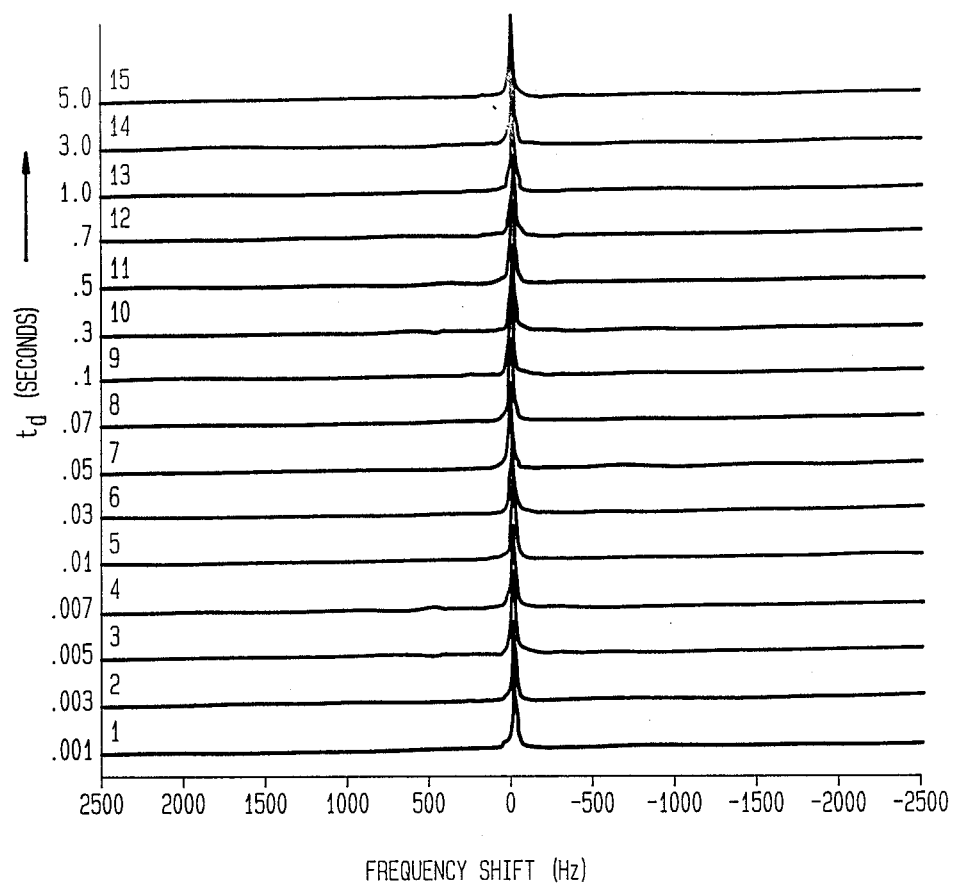

Finally, FIG. 13 and TABLE IV show that the gradient pulse has now been substantially compensated for with respect to the decaying eddy currents, since the Fourier transformed FID signals no longer show any discernable frequency shift as a function of time delay $t_d$.

TABLE IV

| INDEX | DELAY | FREQ | TC | AMP |
|---|---|---|---|---|
| 15 | 5.000 | 0.000 |  |  |
| 14 | 3.000 | −2.443 | X.XXX | XX.X |
| 13 | 1.000 | −4.885 | X.XXX | XX.X |
| 12 | 0.700 | −4.885 | X.XXX | XX.X |
| 11 | 0.500 | −2.443 | X.XXX | XX.X |
| 10 | 0.300 | 2.443 | X.XXX | XX.X |
| 9 | 0.100 | 9.770 | −0.144 | 19.5 |
| 8 | 0.070 | 9.770 | X.XXX | XX.X |
| 7 | 0.050 | 12.213 | −0.090 | 21.3 |
| 6 | 0.030 | 9.770 | 0.090 | 7.0 |
| 5 | 0.010 | 4.885 | 0.029 | 3.5 |
| 4 | 0.007 | 4.885 | X.XXX | XX.X |
| 3 | 0.005 | 2.443 | 0.003 | 0.4 |
| 2 | 0.003 | 2.443 | X.XXX | XX.X |
| 1 | 0.001 | 2.443 | X.XXX | XX.X |

This concludes the compensation technique for the X-axis, and can be repeated for compensation of the Y and Z axes, if While the invention has been described with reference to particular embodiments and examples, other modifications and variations will occur to those skilled in the art in view of the above teachings. It is noted that although the calculation of the transfer function H(s) was based on one radiation shield at a time, equation 10 holds true in every case, and all coefficients describing il(t) can be calculated simultaneously if H(s) were derived for multiple radiation shields. All such changes, modifications, variations and other uses and applications which do not depart from the spirit and scope of the invention are deemed to be covered by the invention which is limited only by the claims which follow.

I claim:

1. A method for the compensation of an eddy current magnetic field in the magnetic field of a pulsed gradient coil of an MR scanning apparatus, comprising the steps of:
   (a) positioning an MR-active sample a distance along a given coordinate axis within the magnetic field of said gradient coil which is remote from its origin;
   (b) applying a plurality of time-sequential gradient coil pulses to said gradient coil for generating a corresponding plurality of gradient magnetic field pulses along said given coordinate axis;
   (c) irradiating said sample with an RF excitation pulse a given time delay which is increased following application of each of said gradient coil pulses, so as to generate a plurality of time-sequential MR signals;
   (d) measuring and storing as data a Fourier transformation of each of said time-sequential MR signals, said stored data being representative of a measure of said eddy current magnetic field;
   (e) calculating correction coefficients for compensating the magnetic field of said gradient coil with respect to said eddy current magnetic field using peak frequency shift data determined from the stored data of successive ones of said MR signals which have been Fourier transformed; and
   (f) applying said correction coefficients so as to generate a pre-distorted gradient coil pulse which will compensate for the affect of said eddy current magnetic field upon said gradient coil magnetic field.

2. The method as recited in claim 1, wherein said given time delay starts at a minimum time period substantially equal to zero and increases to a maximum time delay which substantially corresponds to that time wherein it is expected that said eddy current magnetic field will no longer effect said gradient coil magnetic field.

3. The method as recited in claim 1, wherein said applying step comprises using said correction coefficients to adjust a pre-emphasis filter which is employed with said gradient coil.

4. The method as recited in claim 1, wherein said applying step comprises using said correction coefficients to cause a computer system to control the generation of said gradient coil pulse.

5. The method as recited in claim 1, wherein said irradiating step generates free induction decay signals as said MR signals.

6. The method as recited in claim 1, wherein said calculating step comprises calculating a time constant and coupling coefficient from the peak frequency shift data corresponding to the longest time constant of said eddy current magnetic field which is reliably represented thereby.

7. The method as recited in claim 1, wherein steps (a)-(e) determine correction coefficients for compensating a monoexponential component of said eddy current magnetic field, and steps (a)-(e) are repeated a plurality of times so as to generate successive sets of correction coefficients, each set substantially compensating for a different mono-exponential component of said eddy current magnetic field.

8. The method as recited in claim 5, wherein said calculating step comprises calculating a time constant and coupling coefficient from the peak frequency shift data corresponding to the longest time constant of said eddy current magnetic field which is reliably represented thereby.

9. The method as recited in claim 8, wherein steps (a)-(e) determine correction coefficients for compensating a monoexponential component of said eddy current magnetic field, and steps (a)-(e) are repeated a plurality of times so as to generate successive sets of correction coefficients, each set substantially compensating for a different mono-exponential component of said eddy current magnetic field.

10. A magnetic resonance (MR) device, comprising:
    a main magnet having a bore axially formed therethrough in which a base field is formed;
    gradient coil means positioned inside said bore of said main magnet, responsive to gradient coil pulses for providing a plurality of gradient field pulses along a given coordinate axis inside said bore and said gradient coil means;
    an MR-active sample positioned inside said bore at a distance remote from an origin of said given coordinate axis;
    an electrically conductive media located nearby said gradient coil means which produces at least one disturbing magnetic field along said given axis;
    signal sensing means positioned inside said bore of said magnet for sensing a plurality of successive MR signals generated by said MR active sample after irradiation of said sample by a corresponding plurality of successive RF pulses; and
    computer means operatively connected with said signal sensing means and said gradient coil means for measuring and storing as data a Fourier transformation of each of said sensed MR signals, for calculating correction coefficients for compensating the magnetic field of said gradient coil means with respect to said disturbing magnetic field using peak frequency shift data determined from the stored data of successive ones of said MR signals which have been Fourier transformed, and for applying said correction coefficients so as to generate pre-distorted gradient coil pulses which will compensate for the affect of said disturbing magnetic field upon said gradient field pulses.

11. The apparatus of claim 10, wherein said gradient coil means is controlled by said computer means to generate a plurality of time-sequential gradient field pulses and said signal sensing means is controlled by said computer means to irradiate said sample with an RF excitation pulse a given time delay which is increased following application of each of said gradient coil pulses, so as to generate a plurality of time-sequential ones of said MR signals.

12. The apparatus of claim 11, further including a pre-emphasis filter means coupled to said gradient coil means for providing pre-emphasis to said gradient coil pulses in accordance with the correction coefficients calculated by said computer means.

13. The apparatus of claim 12, wherein said computer means calculates a time constant and coupling coefficient by analyzing the stored data corresponding to the longest time constant of the disturbing magnetic field reliably represented thereby.

* * * * *